(12) United States Patent
Kobayashi et al.

(10) Patent No.: US 8,390,062 B2
(45) Date of Patent: Mar. 5, 2013

(54) VERTICAL CHANNEL TRANSISTOR ARRAY AND MANUFACTURING METHOD THEREOF

(75) Inventors: Heiji Kobayashi, Hsinchu (TW); Yukihiro Nagai, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 206 days.

(21) Appl. No.: 12/839,412

(22) Filed: Jul. 20, 2010

(65) Prior Publication Data

US 2012/0018801 A1    Jan. 26, 2012

(51) Int. Cl.
*H01L 29/66* (2006.01)

(52) U.S. Cl. ............ 257/334; 257/E21.41; 257/E27.011; 438/270

(58) Field of Classification Search .................. 257/334, 257/E21.41, E27.011
See application file for complete search history.

(56) References Cited

U.S. PATENT DOCUMENTS

| 7,355,230 B2 | 4/2008 | Thies et al. | |
|---|---|---|---|
| 2005/0082594 A1* | 4/2005 | Brown | 257/306 |
| 2010/0237406 A1* | 9/2010 | Oyu | 257/329 |

* cited by examiner

*Primary Examiner* — Eugene Lee
*Assistant Examiner* — Elias M Ullah
(74) *Attorney, Agent, or Firm* — Jianq Chyun IP Office

(57) ABSTRACT

A vertical channel transistor array has an active region formed by a plurality of semiconductor pillars. A plurality of embedded bit lines are arranged in parallel in a semiconductor substrate and extended along a column direction. A plurality of bit line contacts are respectively disposed on a side of one of the embedded bit lines. A plurality of embedded word lines are arranged in parallel above the embedded bit lines and extended along a row direction. Besides, the embedded word lines connect the semiconductor pillars in the same row with a gate dielectric layer sandwiched between the embedded word lines and the semiconductor pillars. The current leakage isolation structure is disposed at terminals of the embedded bit lines to prevent current leakage between the adjacent bit line contacts.

9 Claims, 22 Drawing Sheets

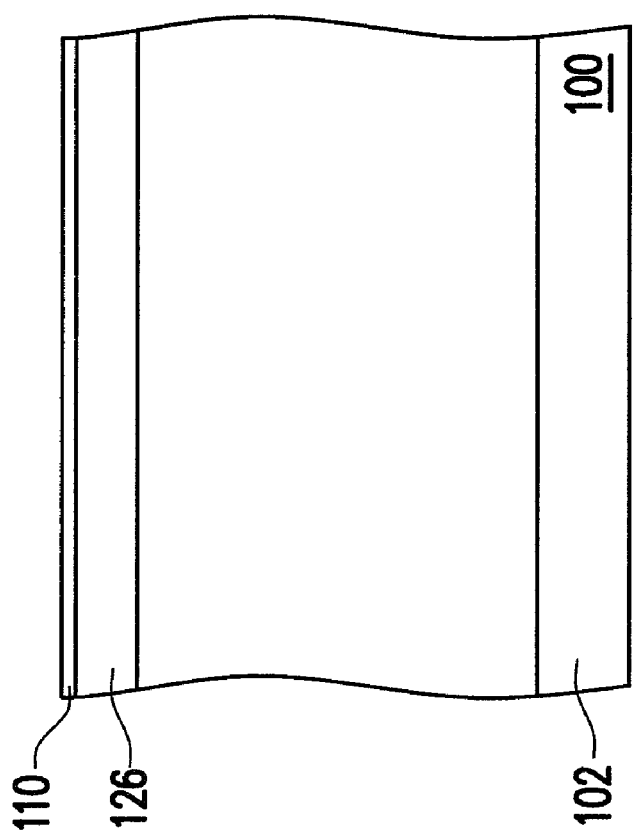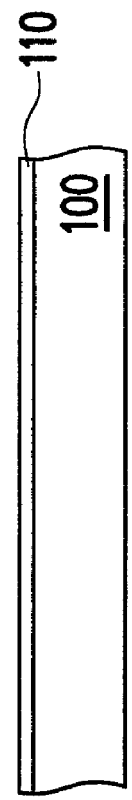
FIG. 4A
FIG. 5A

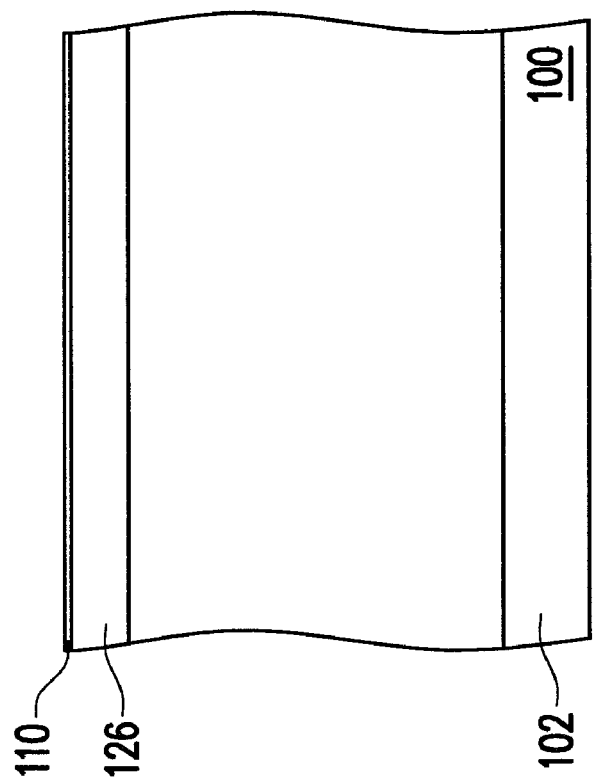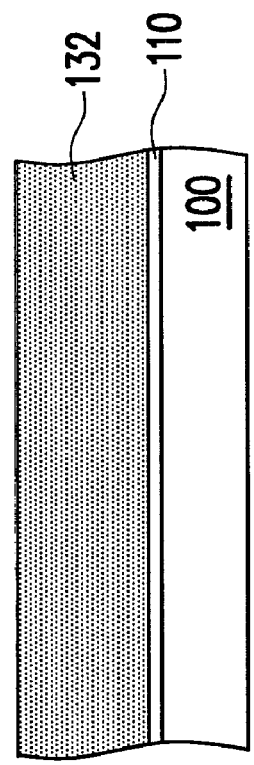
FIG. 5B  FIG.

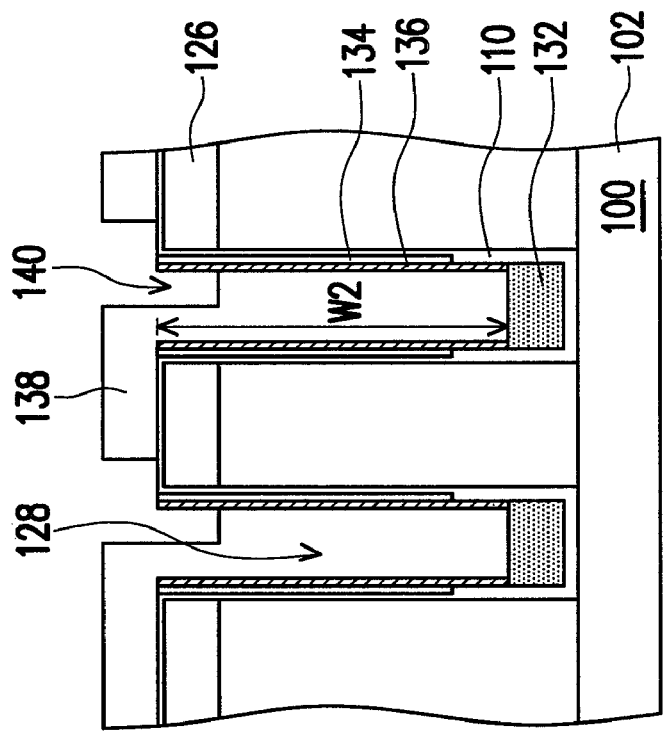
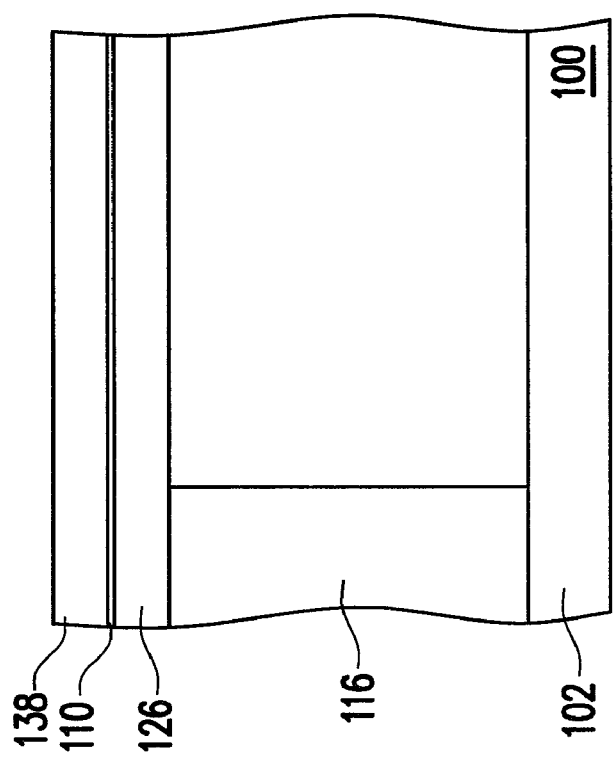
FIG. 3C
FIG. 2C

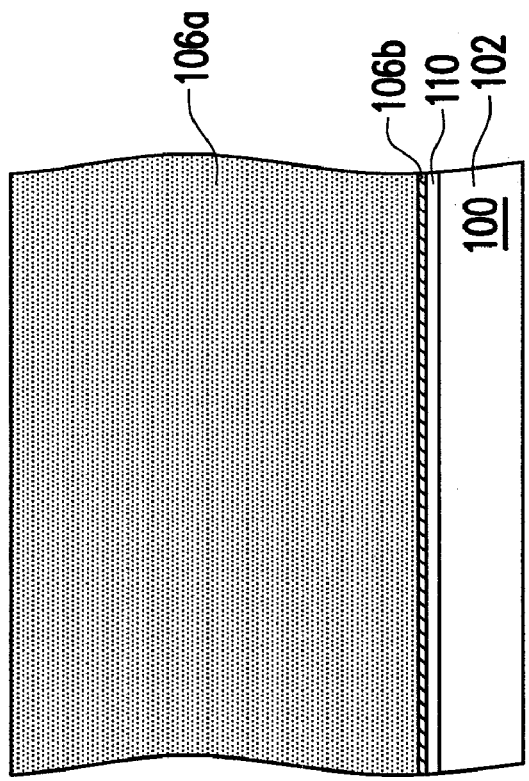
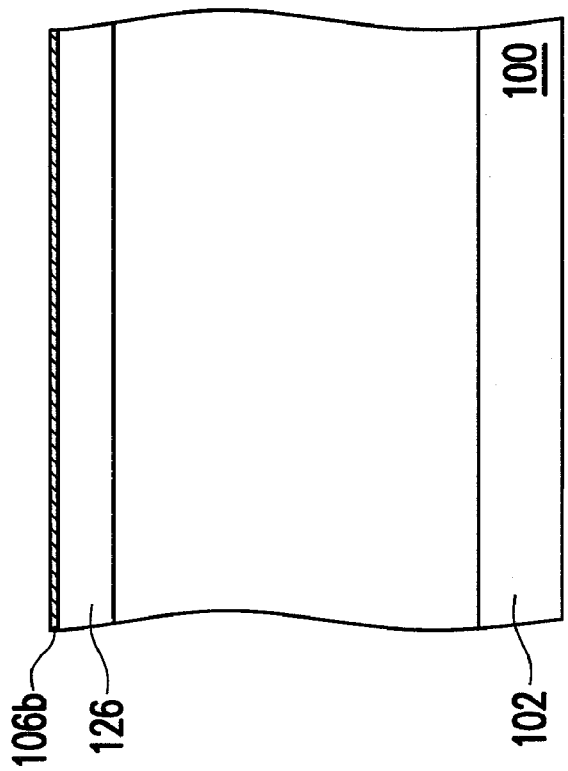

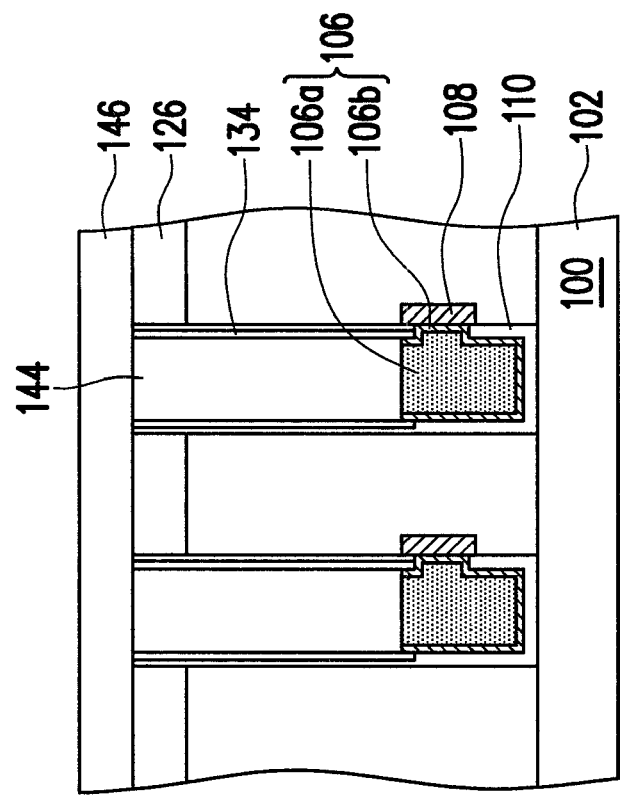
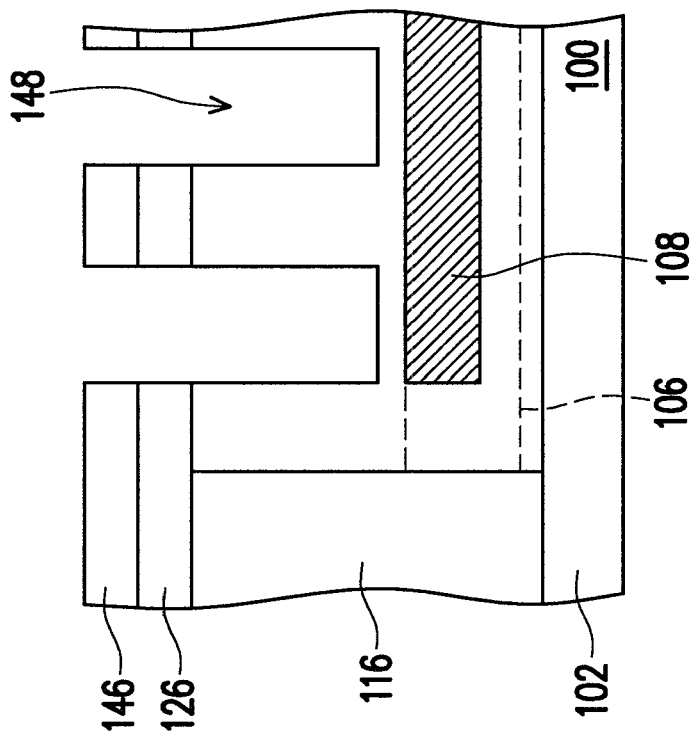
FIG. 2G
FIG. 3G

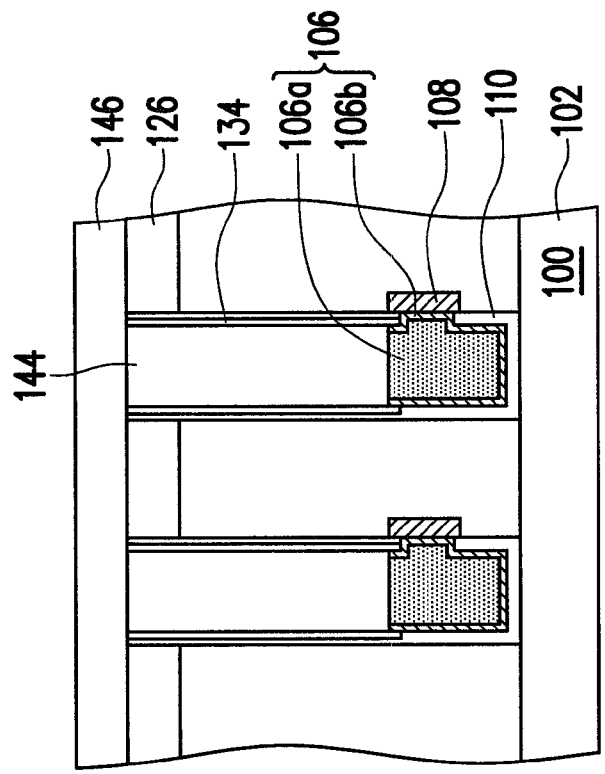
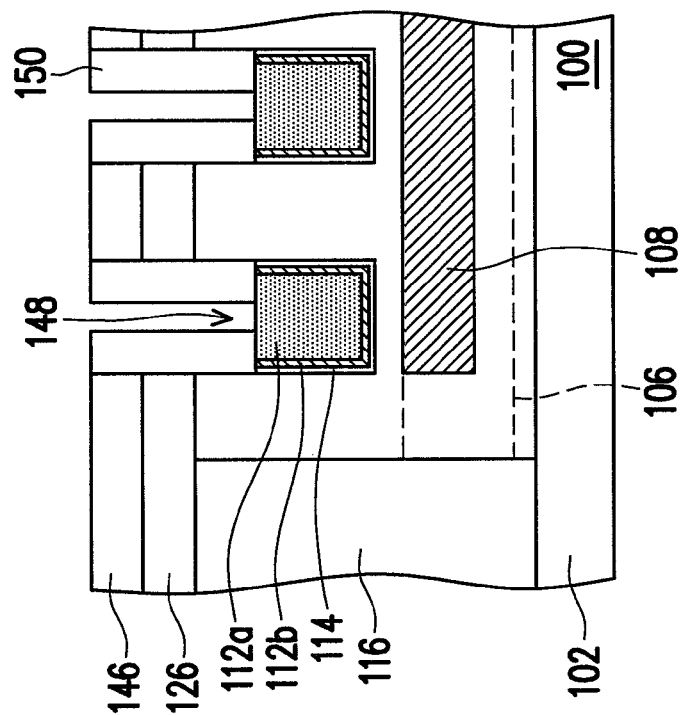
FIG. 2H
FIG. 3H

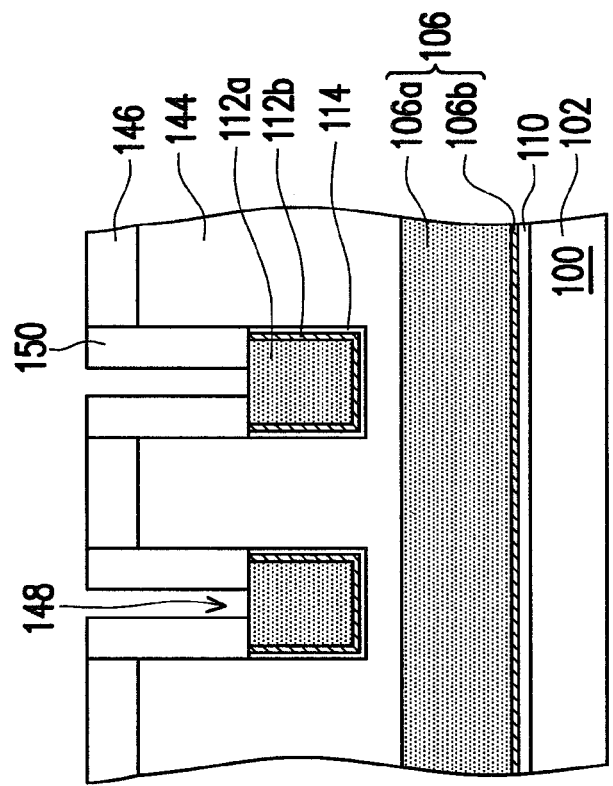

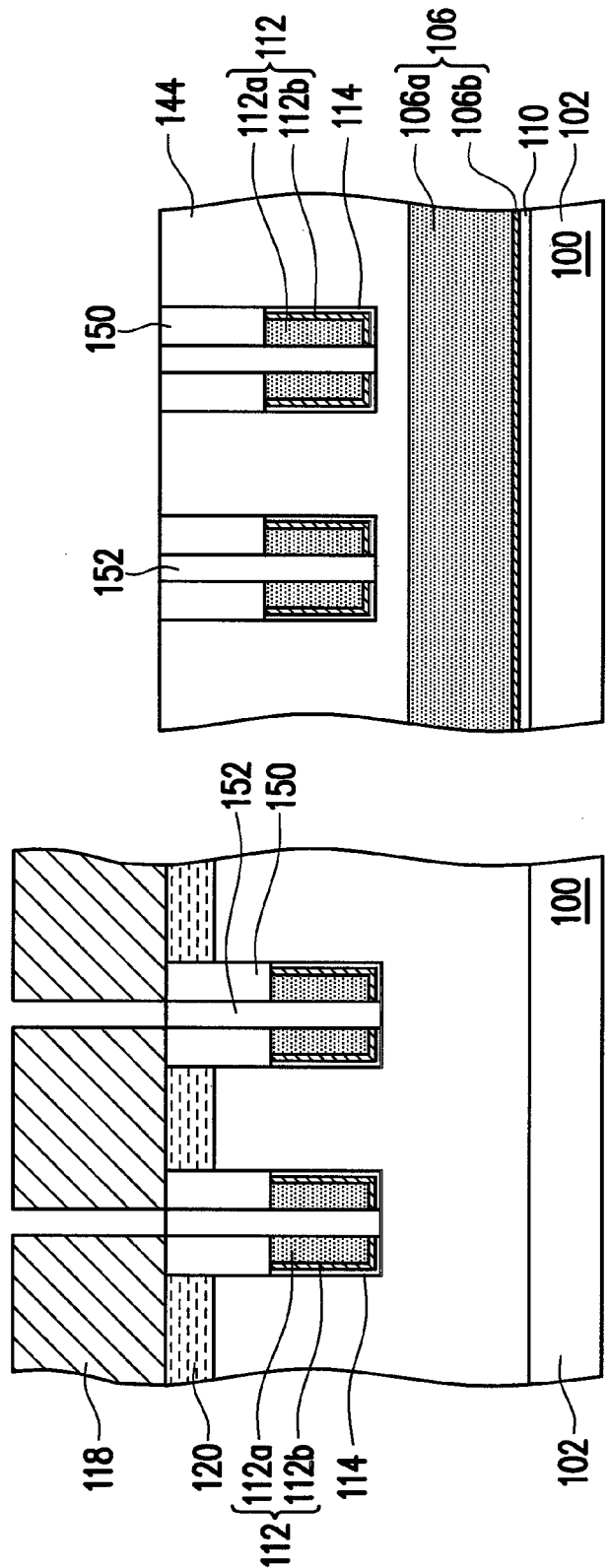

VERTICAL CHANNEL TRANSISTOR ARRAY AND MANUFACTURING METHOD THEREOF

BACKGROUND OF THE INVENTION

1. Field of the Invention

The invention relates to a semiconductor device and a manufacturing method thereof. More particularly, the invention relates to a vertical channel transistor array and a manufacturing method thereof.

2. Description of Related Art

With development of powerful microprocessors, software is more capable of programming and calculating an increasing amount of data. Therefore, the fabrication of memories is essential to the semiconductor industry. A dynamic random access memory (DRAM) is a volatile memory formed by a plurality of memory cells. Each of the memory cells is mainly included of a transistor and a capacitor, and all of the memory cells are electrically connected to one another through a word line (WL) and a bit line (BL).

As science and technology advance, a length of a channel region in the transistors of the DRAM is decreased together with the requirement for device size reduction, and thereby operation speed of the device can be increased. Nonetheless, in such case, a short channel effect is likely to occur in the transistors, and an On current may be decreased.

Hence, according to the related art, a horizontal transistor is changed to a vertical transistor. As proposed in U.S. Pat. No. 7,355,230, the vertical transistors are formed in trenches in the DRAM, and embedded bit lines and embedded word lines are formed as well.

Yet, with miniaturization of the device, the distance between the adjacent embedded bit lines is decreased. As such, during operation of the DRAM, current leakage is prone to occur at bottoms and terminals of the embedded bit lines, which further deteriorates device performance.

SUMMARY OF THE INVENTION

Accordingly, the invention is directed to a vertical channel transistor array and a manufacturing method thereof, which can prevent current leakage between adjacent bit lines and improve device performance.

In the invention, a vertical channel transistor array including a plurality of semiconductor pillars, a plurality of embedded bit lines, a plurality of bit line contacts, a plurality of embedded word lines, and a current leakage isolation structure is provided. The semiconductor pillars are disposed in a semiconductor substrate and arranged in a row/column array. Each of the semiconductor pillars forms an active region of the vertical channel transistor array. The embedded bit lines are arranged in parallel in the semiconductor substrate and extended along a column direction. Each of the bit line contacts is respectively disposed at a side of one of the embedded bit lines, and the embedded bit lines are electrically connected to the semiconductor pillars located in the same column through the bit line contacts. The embedded word lines are arranged in parallel above the embedded bit lines and extended along a row direction. Besides, the embedded word lines connect the semiconductor pillars in the same row with a gate dielectric layer sandwiched between the embedded word lines and the semiconductor pillars. The current leakage isolation structure is disposed at terminals of the embedded bit lines to prevent current leakage between the adjacent bit line contacts.

According to an embodiment of the invention, the current leakage isolation structure is a shallow trench isolation (STI) structure.

According to an embodiment of the invention, the STI structure includes a plurality of STI blocks.

According to an embodiment of the invention, the current leakage isolation structure is a doped region.

According to an embodiment of the invention, each of the embedded word lines is connected to a first side and a second side of one of the semiconductor pillars in the same column, and the first side is opposite to the second side.

According to an embodiment of the invention, the vertical channel transistor array further includes a current leakage isolation doped region. The current leakage isolation doped region is disposed in the semiconductor substrate located below the embedded bit lines, so as to prevent the adjacent bit line contacts from generating current leakage at bottoms of the embedded bit lines.

According to an embodiment of the invention, each of the embedded bit lines includes a barrier layer and a conductive layer.

According to an embodiment of the invention, the vertical channel transistor array further includes an insulating layer. The insulating layer is disposed between each of the embedded bit lines and the semiconductor substrate.

According to an embodiment of the invention, a material of the bit line contacts includes silicide.

In the invention, a manufacturing method of a vertical channel transistor array includes following steps. A semiconductor substrate is provided. A plurality of first trenches are formed in the semiconductor substrate, and the first trenches are arranged in parallel and extended along a column direction. A plurality of embedded bit lines are formed at bottoms of the first trenches. A plurality of bit line contacts are formed. Each of the bit line contacts is formed at a side of one of the embedded bit lines, and the embedded bit lines are electrically connected to the semiconductor substrate through the bit line contacts. A plurality of second trenches are formed in the semiconductor substrate. The second trenches are arranged in parallel and extended along a row direction. The semiconductor substrate is divided into a plurality of semiconductor pillars by the first trenches and the second trenches. A gate dielectric layer is formed on surfaces of the semiconductor pillars. A plurality of embedded word lines are formed at bottoms of the second trenches. A current leakage isolation structure is formed in the semiconductor substrate to prevent current leakage between the adjacent bit line contacts, wherein the current leakage isolation structure is disposed at terminals of the embedded bit lines.

According to an embodiment of the invention, the current leakage isolation structure is a shallow trench isolation (STI) structure. The current leakage isolation structure is formed before forming the first trenches in the semiconductor substrate The STI structure is formed by a plurality of STI blocks.

According to an embodiment of the invention, the current leakage isolation structure is a doped region. The current leakage isolation structure is formed after forming embedded word lines in the semiconductor substrate. A method of forming the doped region includes ion implantation.

According to an embodiment of the invention, the manufacturing method of the vertical channel transistor array further includes forming a current leakage isolation doped region in the semiconductor substrate located below the embedded bit lines to prevent the adjacent bit line contacts from generating current leakage at bottoms of the embedded bit lines.

According to an embodiment of the invention, the manufacturing method of the vertical channel transistor array further includes forming an insulating layer between each of the embedded bit lines and the semiconductor substrate.

According to an embodiment of the invention, the step of forming the embedded bit lines at the bottoms of the first trenches and the step of forming each of the bit line contacts at the side of one of the embedded bit lines are described below. The insulating layer is formed on the semiconductor substrate. A trench filling material layer is formed in the first trenches, and a first distance exists between a surface of the trench filling material layer and top surfaces of the first trenches. A first liner layer is formed on a surface of the insulating layer exposed by the trench filling material layer. A portion of the trench filling material layer is removed, such that a second distance exists between the surface of the trench filling material layer and the top surfaces of the first trenches. Here, the second distance is greater than the first distance. A second liner layer is formed on a surface of the first liner and the surface of the insulating layer exposed by the trench filling material layer. The second liner layer located at a first side of each of the first trenches is removed. The insulating layer exposed by the first liner layer is removed. The remaining second liner layer is removed. A first barrier layer and a first conductive layer are sequentially formed in each of the first trenches, and each of the first trenches is filled with the first conductive layer. A portion of the first conductive layer and a portion of the first barrier layer are removed to form the embedded bit lines at the bottoms of the first trenches. The bit line contacts are formed at the sides of the embedded bit lines by causing a reaction between the first barrier layers and the semiconductor substrate.

According to an embodiment of the invention, the step of forming a plurality of embedded word lines at the bottoms of the second trenches is described below. A second barrier layer and a second conductive layer are sequentially formed in each of the second trenches. A portion of the second barrier layer and a portion of the second conductive layer are removed, such that a surface of the second conductive layer and the second barrier layer are lower than a surface of the semiconductor substrate. A mask layer is formed on side walls of each of the second trenches. The remaining second barrier layer and the remaining second conductive layer are removed with use of the mask layer as a mask, so as to form the embedded word lines.

According to an embodiment of the invention, the step of forming the current leakage isolation structure is after the step of forming embedded bit lines but before the step of forming embedded word lines in the semiconductor substrate.

In the vertical channel transistor array of the invention, the current leakage isolation structure is formed at the terminals of the embedded bit lines, and thereby current leakage between the adjacent bit line contacts can be prevented during operation of the vertical channel transistor array.

In addition, the current leakage isolation doped region is formed in the semiconductor substrate located below the embedded bit lines; therefore, the adjacent bit line contacts are prevented from generating current leakage at the bottoms of the embedded bit lines during operation of the vertical channel transistor array.

On the other hand, according to the manufacturing method of the vertical channel transistor array of the invention, the current leakage isolation structure is formed at the terminals of the embedded bit lines, and thereby current leakage between the adjacent bit line contacts can be prevented during operation of the vertical channel transistor array. Since the current leakage isolation structure can be the STI structure or the doped region, the simple manufacturing process of the current leakage isolation structure can be easily integrated into the general manufacturing process.

Besides, the current leakage isolation doped region is formed in the semiconductor substrate located below the embedded bit lines; therefore, the adjacent bit line contacts are prevented from generating current leakage at the bottoms of the embedded bit lines during operation of the vertical channel transistor array.

To sum up, the vertical channel transistor array and the manufacturing method thereof in the invention not only can prevent current leakage between the adjacent bit line contacts but also can improve device performance.

To make the above and other features and advantages of the invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2I are cross-sectional views illustrating a manufacturing process of the DRAM having the vertical channel transistor array depicted FIG. 1B along the line A-A'.

FIG. 3A to FIG. 3I are cross-sectional views illustrating a manufacturing process of the DRAM having the vertical channel transistor array depicted FIG. 1B along the line B-B'.

FIG. 4A to FIG. 4I are cross-sectional views illustrating a manufacturing process of the DRAM having the vertical channel transistor array depicted FIG. 1B along the line C-C'.

FIG. 5A to FIG. 5I are cross-sectional views illustrating a manufacturing process of the DRAM having the vertical channel transistor array depicted FIG. 1B along the line D-D'.

DESCRIPTION OF EMBODIMENTS

In the invention, a vertical channel transistor array is provided, and the vertical channel transistor array exemplarily applied to a DRAM is described below.

Figure 1A:
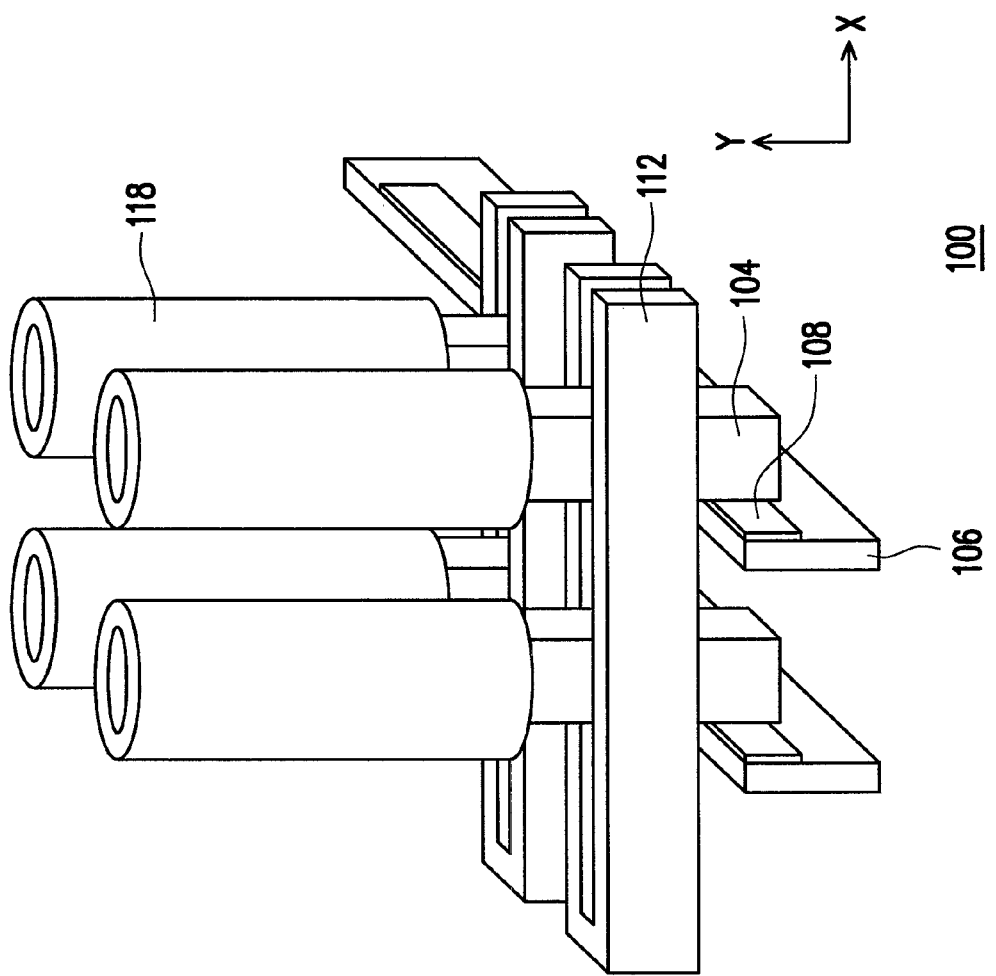
FIG. 1A is a partial perspective view illustrating a DRAM having a vertical channel transistor array according to an embodiment of the invention.

FIG. 1A is a partial perspective view illustrating a DRAM having a vertical channel transistor array according to an embodiment of the invention. To simplify the drawings, only the main components including semiconductor pillars, embedded bit lines, bit line contacts, embedded word lines, and capacitor nodes are illustrated.

Figure 1B:
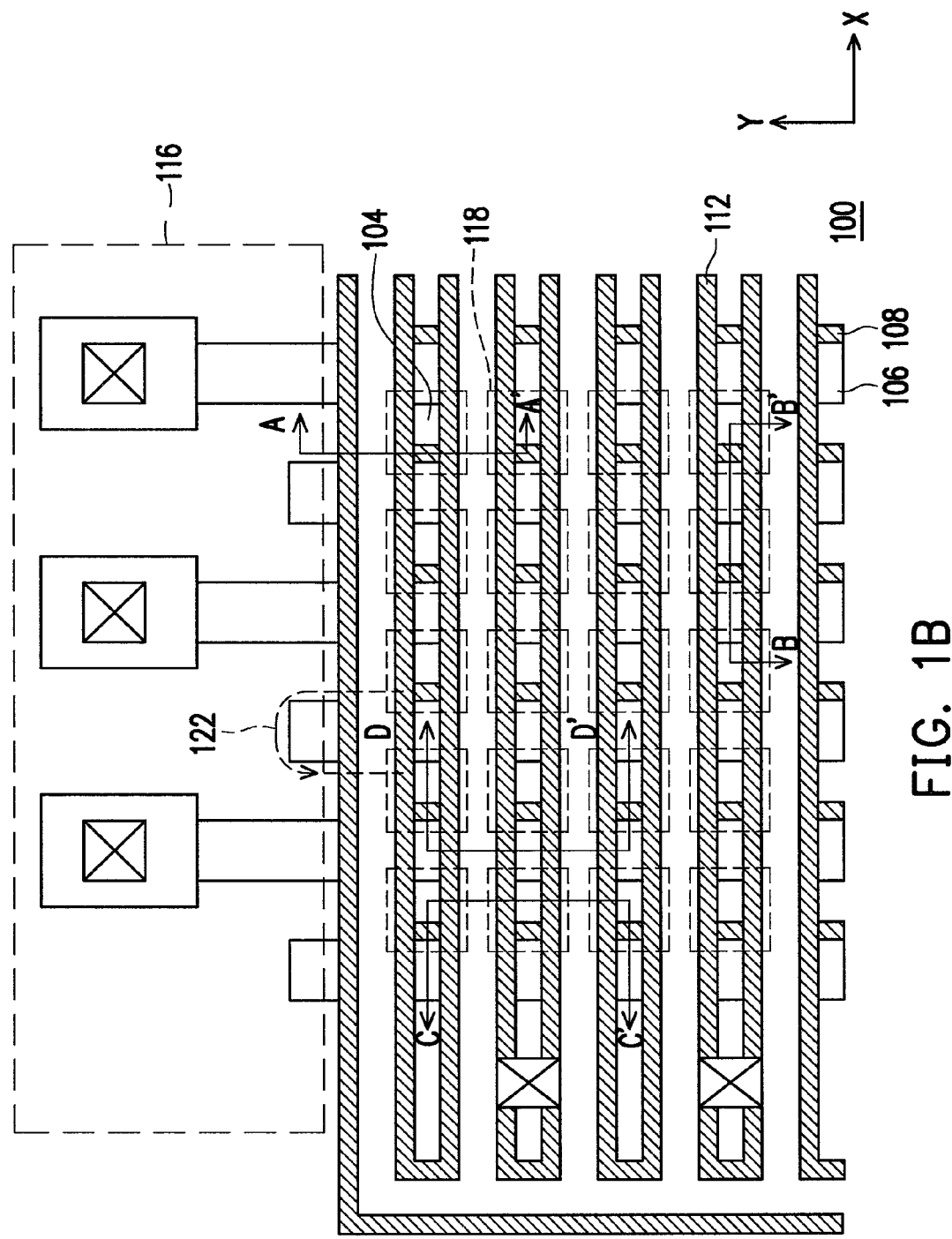
FIG. 1B is a top view illustrating a DRAM having a vertical channel transistor array according to an embodiment of the invention.
Figure 1C:
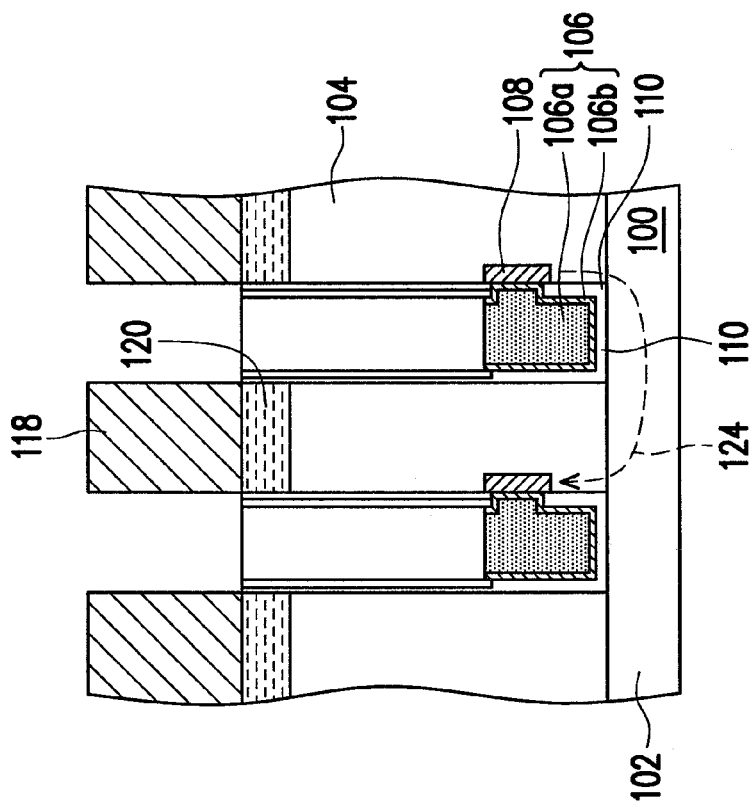
FIG. 1C is a cross-sectional view taken along a line A-A' depicted in FIG. 1B.
Figure 1D:
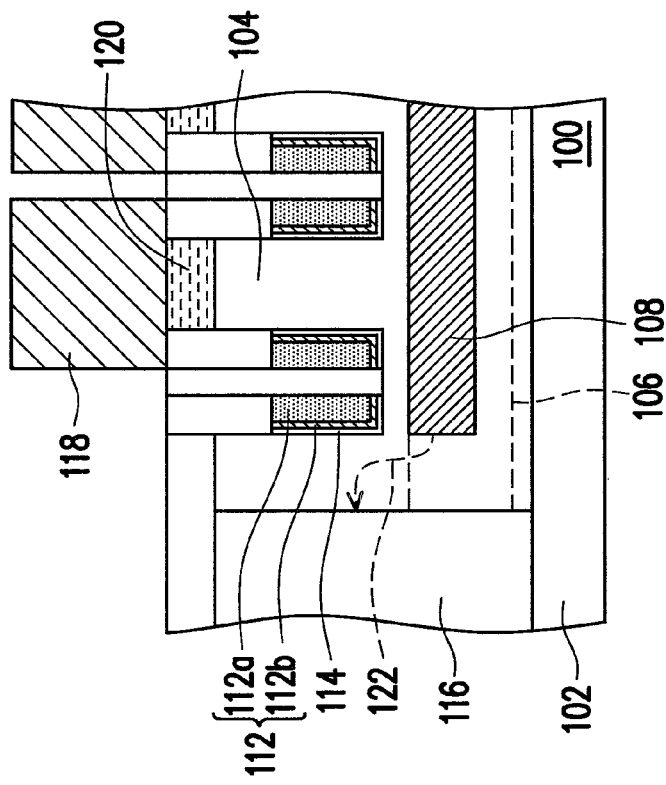
FIG. 1D is a cross-sectional view taken along a line B-B' depicted in FIG. 1B.
Figure 1F:
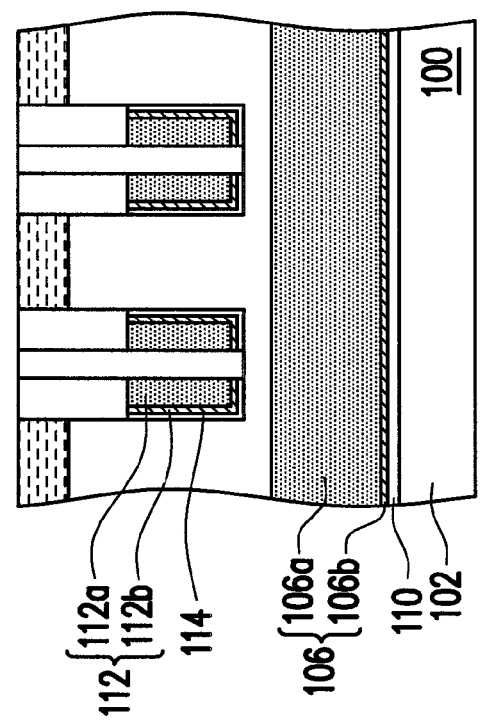
FIG. 1F is a cross-sectional view taken along a line D-D' depicted in FIG. 1B.
Figure 1E:
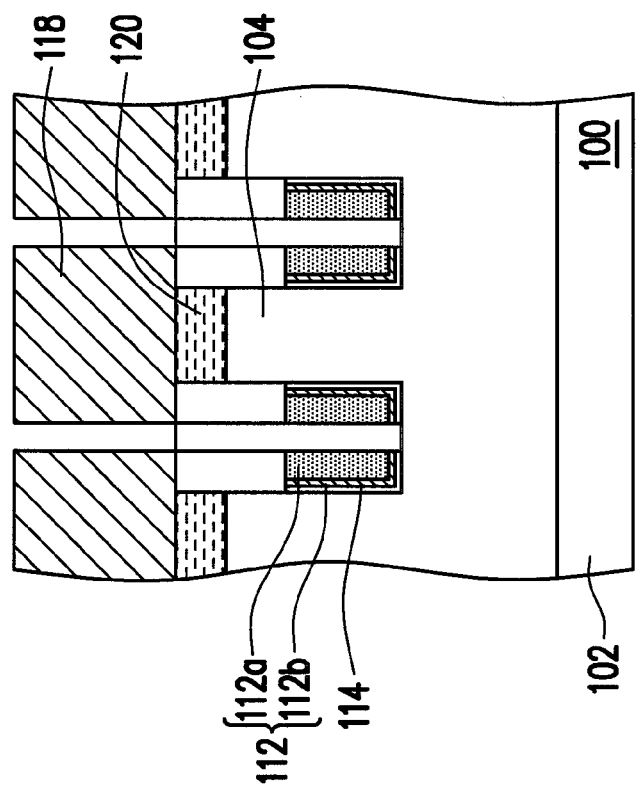
FIG. 1E is a cross-sectional view taken along a line C-C' depicted in FIG. 1B.
Figure 3A:
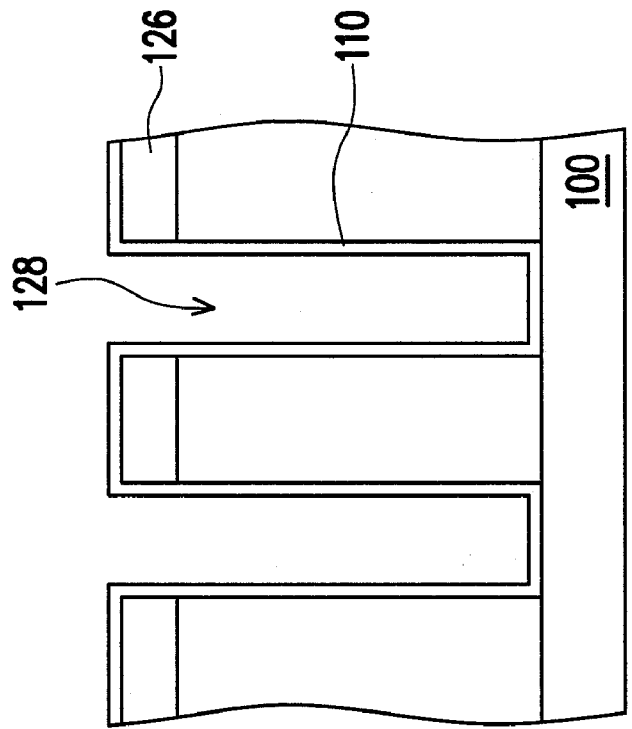
Figure 2A:
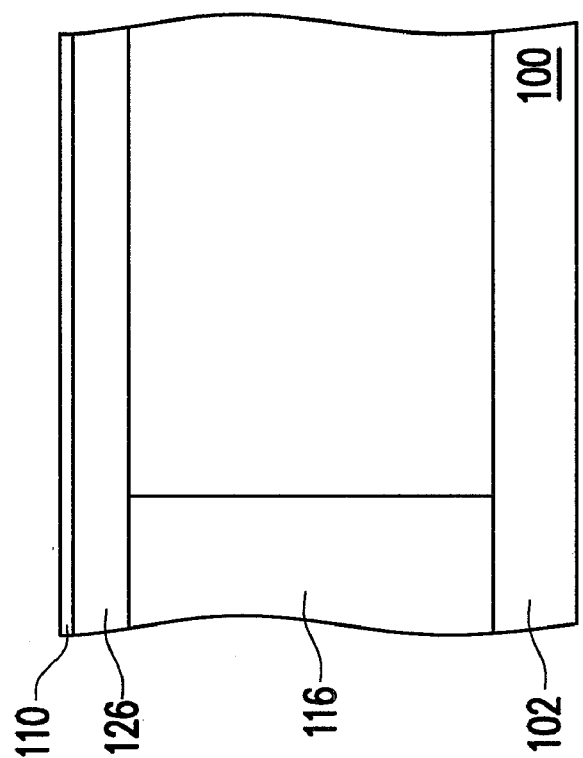
Figure 3B:
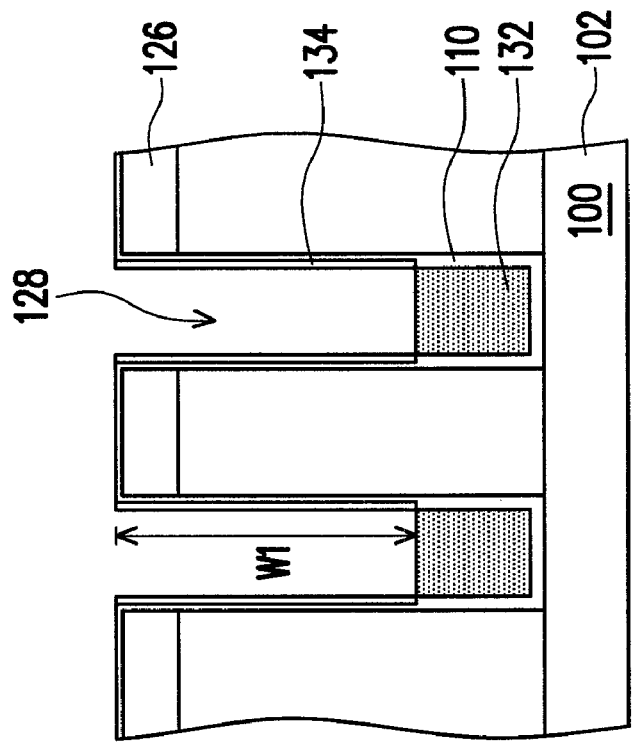
Figure 2B:
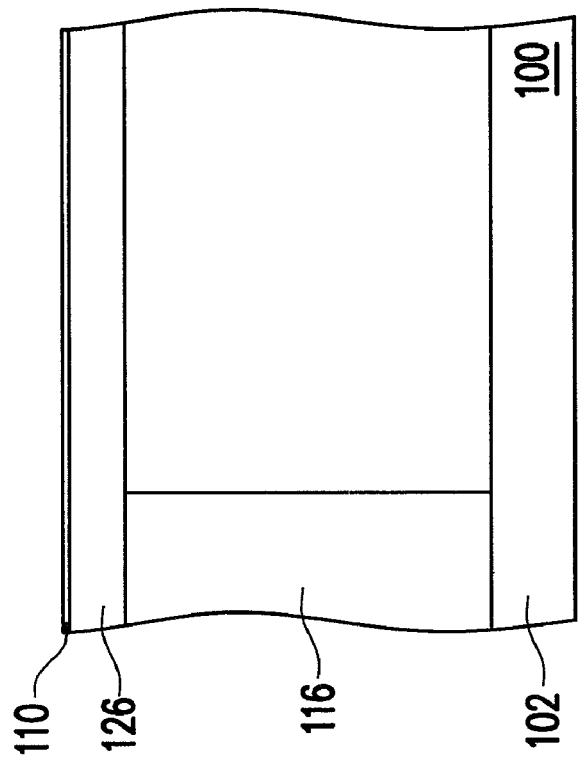
Figure 5C:
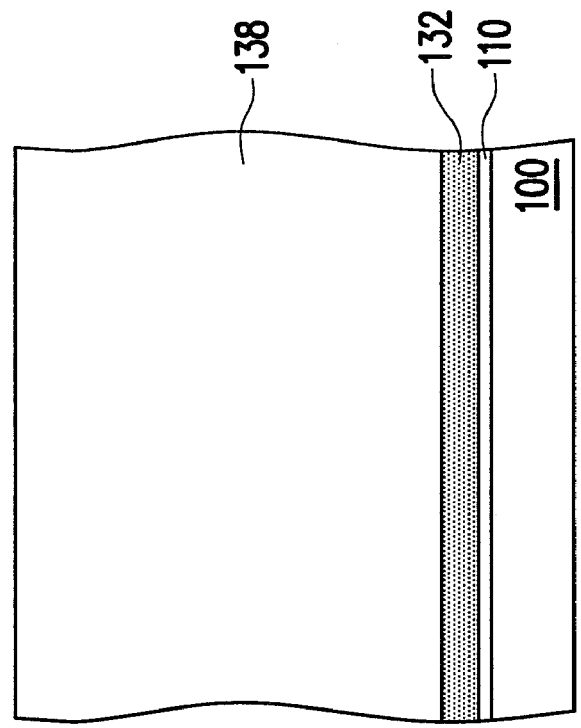
Figure 4C:
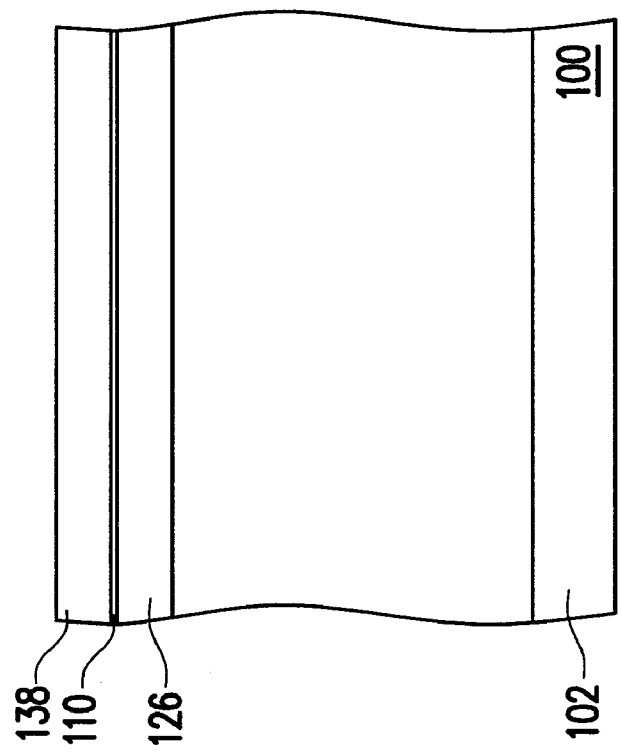
Figure 3D:
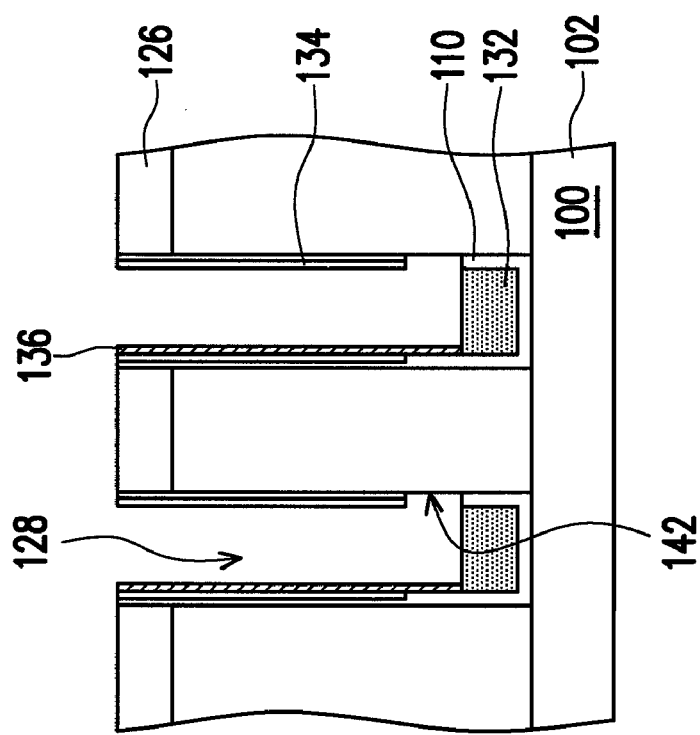
Figure 2D:
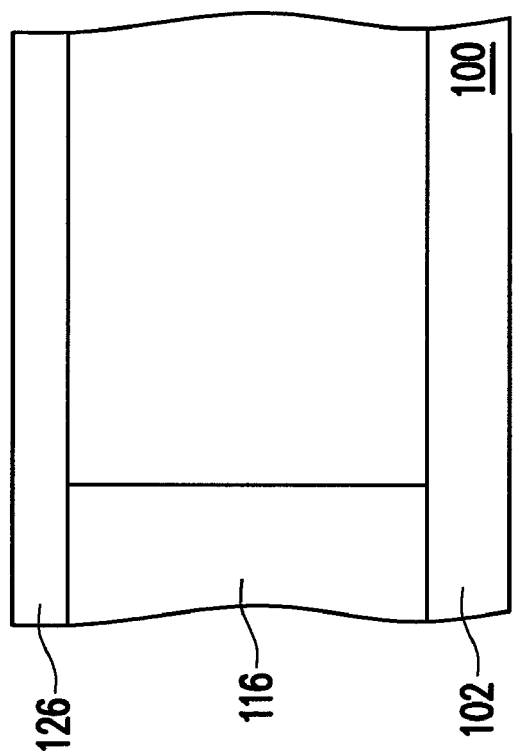
Figures 4D, 5D:
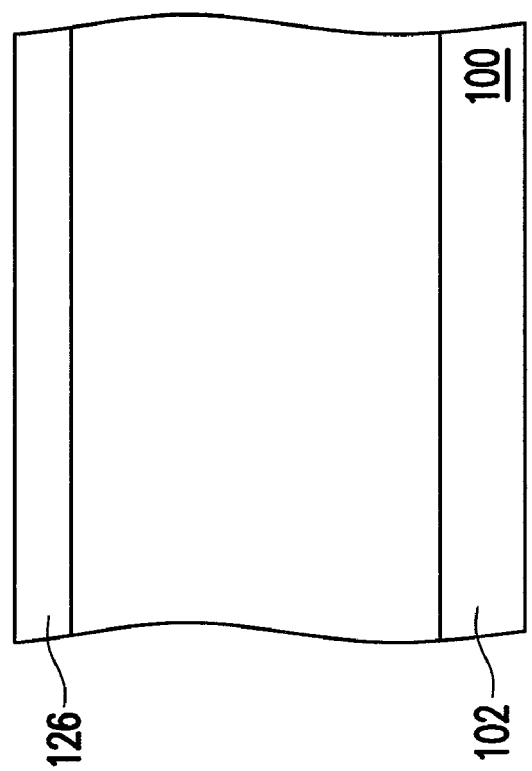
Figure 3E:
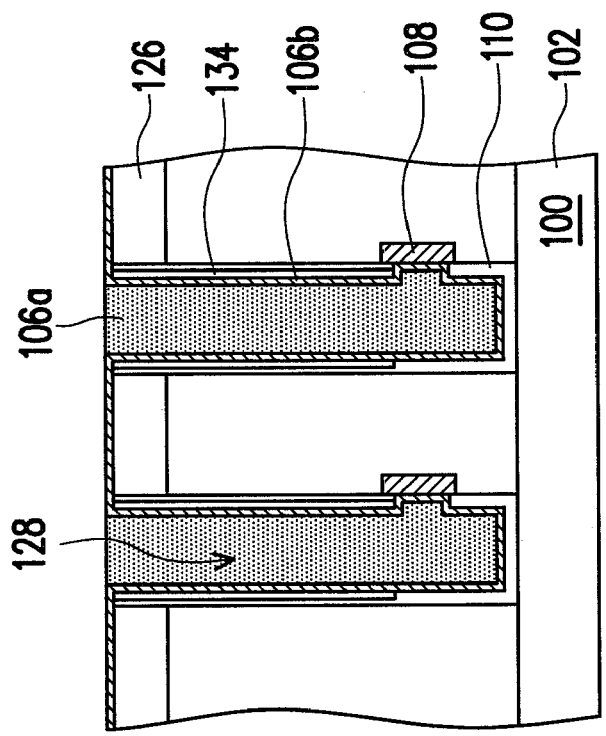
Figure 2E:
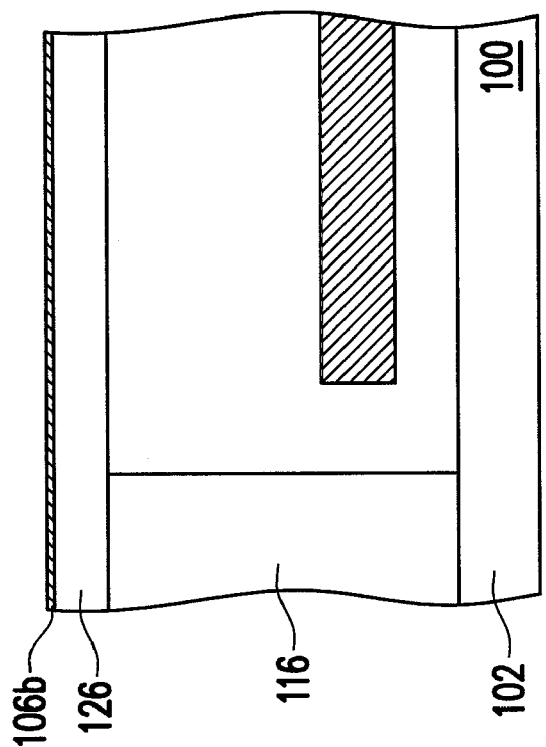
Figure 3F:
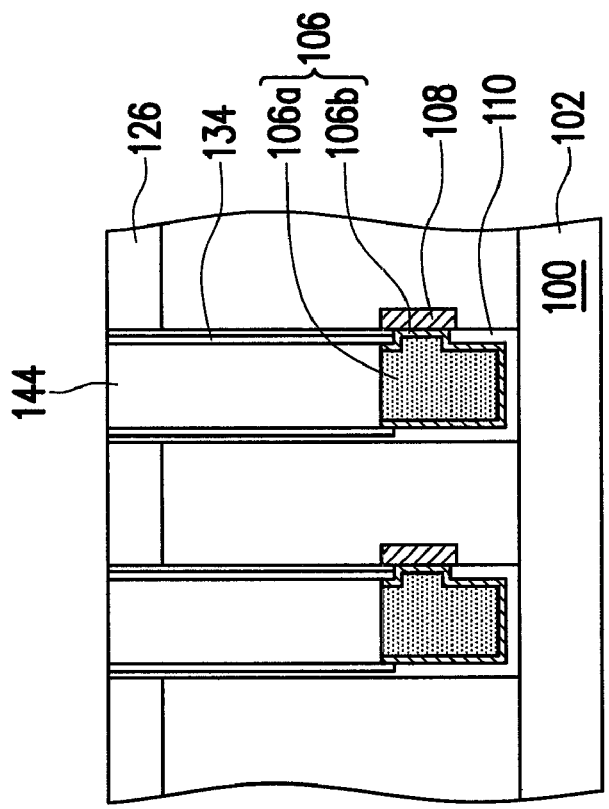
Figure 2F:
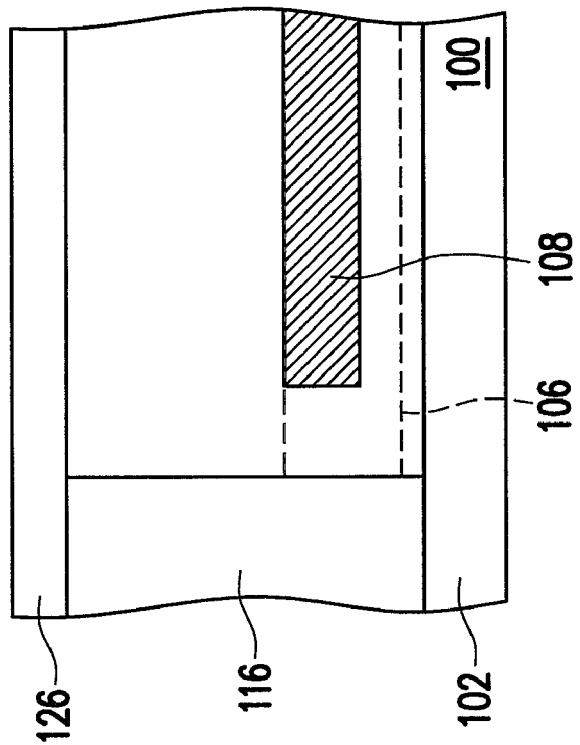
Figure 5F:
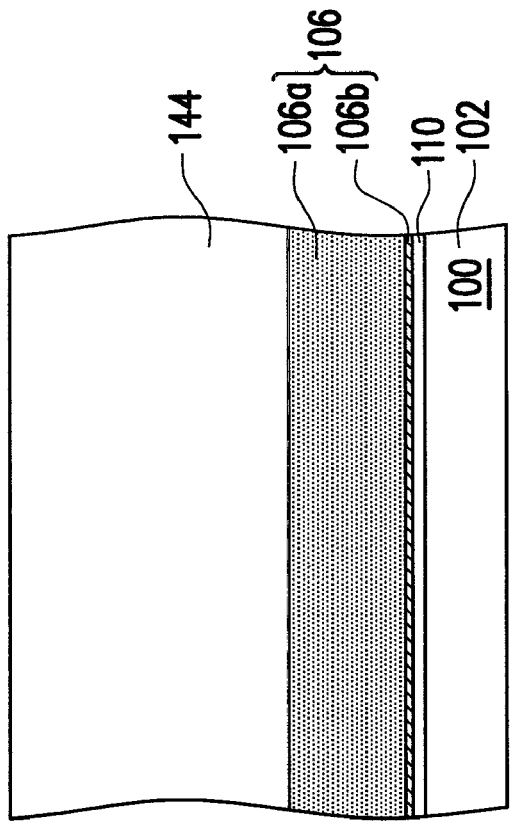
Figure 4F:
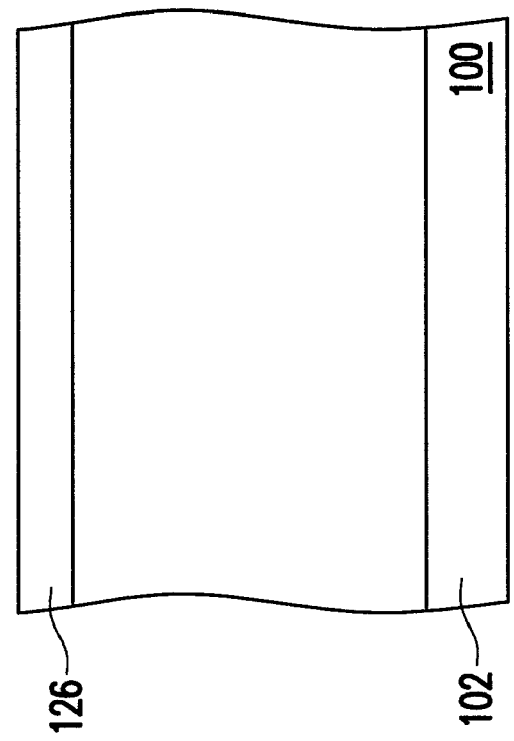
Figure 5G:
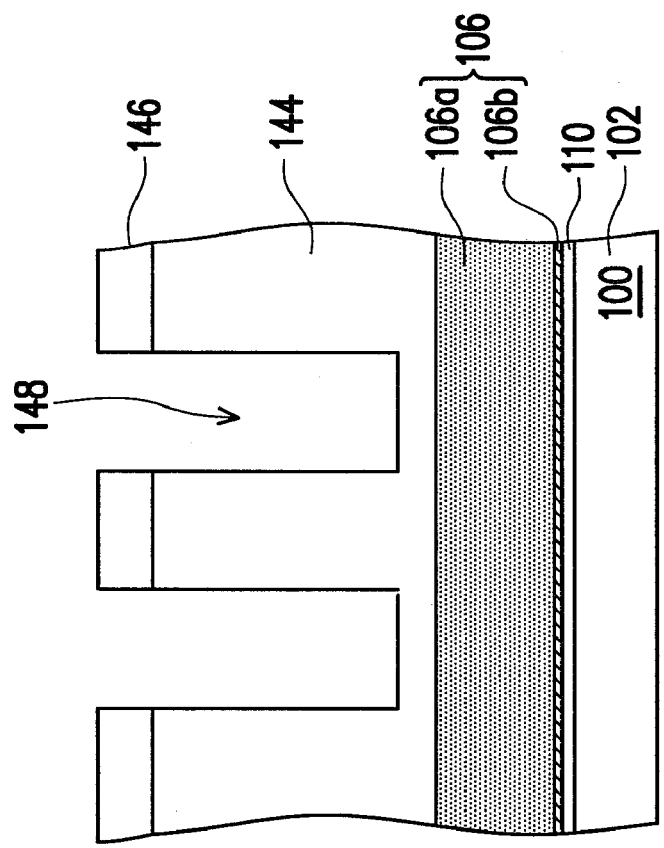
Figure 4G:
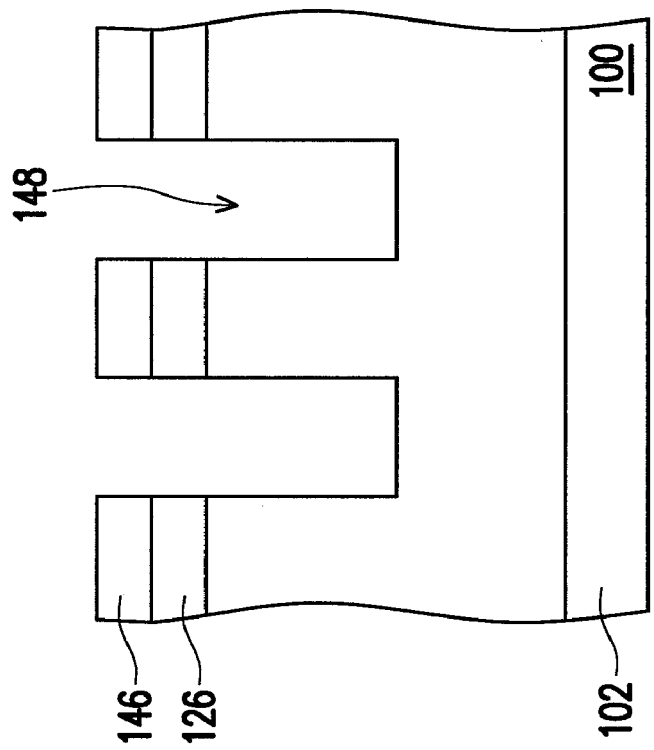
Figure 3I:
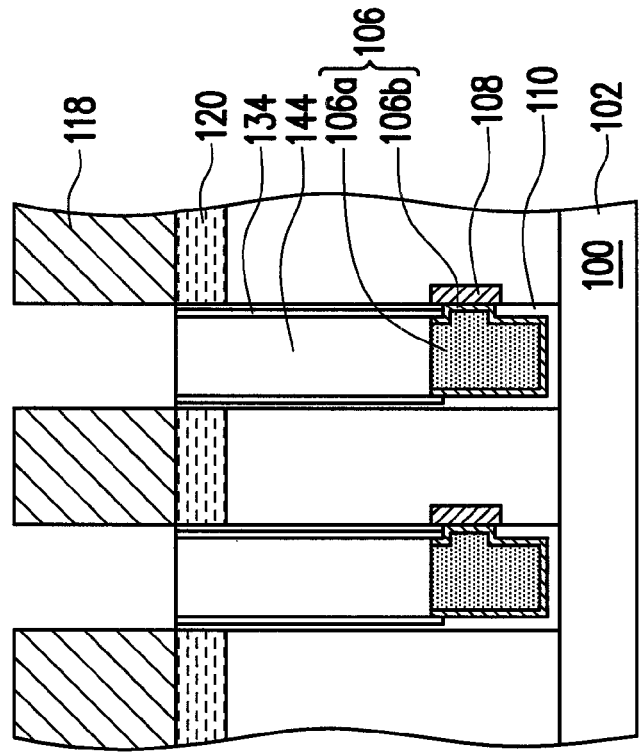
Figure 2I:
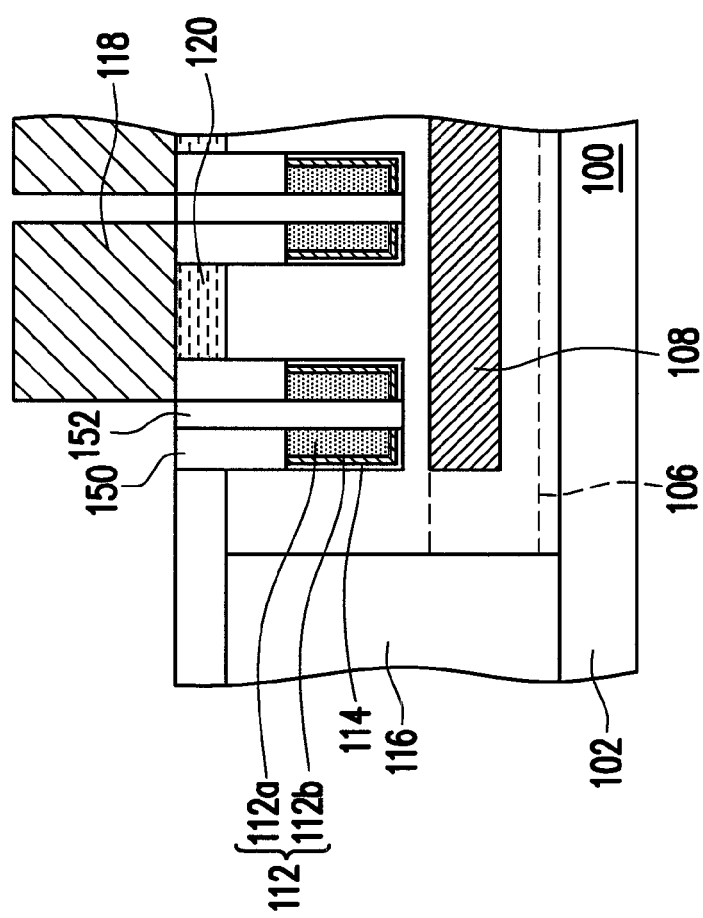

FIG. 1B is a top view illustrating a DRAM having a vertical channel transistor array according to an embodiment of the invention. FIG. 1C is a cross-sectional view taken along a line A-A' depicted in FIG. 1B. FIG. 1D is a cross-sectional view taken along a line B-B' depicted in FIG. 1B. FIG. 1E is a cross-sectional view taken along a line C-C' depicted in FIG. 1B. FIG. 1F is a cross-sectional view taken along a line D-D' depicted in FIG. 1B.

As shown in FIG. 1A to FIG. 1F, the DRAM having the vertical channel transistor array is disposed in a semiconductor substrate 100 according to this invention. The semiconductor substrate 100, for example, is a silicon substrate.

The vertical channel transistor array includes a current leakage isolation doped region 102, a plurality of semiconductor pillars 104, a plurality of embedded bit lines 106, a plurality of bit line contacts 108, an insulating layer 110, a plurality of embedded word lines 112, a gate dielectric layer 114, and a current leakage isolation structure 116.

The semiconductor pillars 104 are disposed in the semiconductor substrate 100 and arranged in a row/column array. Each of the semiconductor pillars 104 forms an active region of the vertical channel transistor array.

The embedded bit lines 106 are arranged in parallel in the semiconductor substrate 100 and extended along a column direction (i.e. the Y direction). Each of the embedded bit lines 106 is formed by a conductive layer 106a and a barrier layer 106b, for instance. A material of the conductive layer 106a includes a metal material, such as tungsten, copper, aluminum, a copper aluminum alloy, a silicon copper aluminum alloy, etc. The barrier layer 106b, for example, is made of titanium (Ti)/titanium nitride (TiN) or cobalt (Co)/TiN.

Each of the bit line contacts 108 is respectively disposed at a side of one of the embedded bit lines 106, and the embedded bit lines 106 are electrically connected to the semiconductor pillars 104 located in the same column through the bit line contacts 108. A material of the bit line contacts 108 includes silicide, such as titanium silicide, cobalt silicide, and so on.

The insulating layer 110 is disposed between each of the embedded bit lines 106 and the semiconductor substrate 100.

The embedded word lines 112 are arranged in parallel above the embedded bit lines 106 and extended along a row direction (i.e. the X direction). Besides, the embedded word lines 112 connect the semiconductor pillars 104 in the same row with a gate dielectric layer 114 sandwiched between the embedded word lines 112 and the semiconductor pillars 104. Each of the embedded word lines 112 is connected to a first side and a second side of one of the semiconductor pillars 104 located in the same row, and the first side is opposite to the second side.

Each of the embedded word lines 112 is formed by a conductive layer 112a and a barrier layer 112b, for instance. A material of the conductive layer 112a includes a metal material, such as tungsten, copper, aluminum, a copper aluminum alloy, a silicon copper aluminum alloy, etc. The barrier layer 112b, for example, is made of TiN, Ti/TiN, or Co/TiN.

The current leakage isolation structure 116 is disposed at terminals of the embedded bit lines 106 to prevent current leakage between the adjacent bit line contacts 108 (as indicated in FIG. 1C). According to an embodiment of the invention, the current leakage isolation structure 116, for example, is an STI structure as a whole or an STI structure formed by a plurality of STI blocks. According to another embodiment of the invention, the current leakage isolation structure 116 is a doped region, for instance. Given the vertical channel transistor is an N-type metal-oxide-semiconductor (NMOS) transistor, the conductive type of the doped region is P-type; given the vertical channel transistor is a P-type metal-oxide-semiconductor (PMOS) transistor, the conductive type of the doped region is N-type.

The current leakage isolation doped region 102 is disposed in the semiconductor substrate 100 located below the embedded bit lines 106, so as to prevent the adjacent bit line contacts 108 from generating current leakage at bottoms of the embedded bit lines 106 (as shown in FIG. 1D). Given the vertical channel transistor is an NMOS transistor, the conductive type of the current leakage isolation doped region 102 is P-type; given the vertical channel transistor is a PMOS transistor, the conductive type of the current leakage isolation doped region 102 is N-type.

As indicated in FIG. 1A, one end of each of the semiconductor pillars 104 connects one of the embedded bit lines 106 through one of the bit line contacts 108, while the other end connects the capacitor node 118 through a contact window 120.

In FIG. 1B, when the vertical channel transistor array does not have the current leakage isolation structure 116, the bit line contacts 108 directly come into contact with the semiconductor substrate 100. When a voltage is applied to a selected one of the embedded bit lines 106, current leakage is induced between one of the bit line contacts 108 connected to the selected embedded bit line 106 and another one of the bit line contacts 108 connected to an unselected embedded bit line 106 adjacent to the selected embedded bit line 106 (e.g. a current leakage path 122 depicted in FIG. 1B and FIG. 1C). In the vertical channel transistor array of the invention, the current leakage isolation structure 116 is formed at the terminals of the embedded bit lines 106, and thereby current leakage between the adjacent bit line contacts 108 can be prevented during operation of the vertical channel transistor array. Namely, the current leakage isolation structure 116 can block the current leakage path 122 indicated in FIG. 1B and FIG. 1C.

On the other hand, when the vertical channel transistor array does not have the current leakage isolation doped region 102, and a voltage is applied to a selected one of the embedded bit lines 106, current leakage is induced between one of the bit line contacts 108 connected to the selected embedded bit line 106 and another one of the bit line contacts 108 connected to an unselected embedded bit line 106 adjacent to the selected embedded bit line 106 (e.g. a current leakage path 124 depicted in FIG. 1D). In the vertical channel transistor array of the invention, the current leakage isolation doped region 102 is formed in the semiconductor substrate 100 located below the embedded bit lines 106, and thereby the adjacent bit line contacts 108 can be prevented from generating current leakage at bottoms of the embedded bit lines 106 during operation of the vertical channel transistor array. Namely, the current leakage isolation doped region 102 can block the current leakage path 124 indicated in FIG. 1D.

To sum up, the vertical channel transistor array of the invention not only can prevent current leakage between the adjacent bit line contacts but also can improve device performance.

A manufacturing method of a DRAM having a vertical channel transistor array is described below according to the invention. FIG. 2A to FIG. 2I are cross-sectional views illustrating a manufacturing process of the DRAM having the vertical channel transistor array depicted FIG. 1B along the line A-A'. FIG. 3A to FIG. 3I are cross-sectional views illustrating a manufacturing process of the DRAM having the vertical channel transistor array depicted FIG. 1B along the line B-B'. FIG. 4A to FIG. 4I are cross-sectional views illustrating a manufacturing process of the DRAM having the vertical channel transistor array depicted FIG. 1B along the line C-C'. FIG. 5A to FIG. 5I are cross-sectional views illustrating a manufacturing process of the DRAM having the vertical channel transistor array depicted FIG. 1B along the line D-D'.

As shown in FIG. 2A to FIG. 5A, a semiconductor substrate 100 is provided. The semiconductor substrate 100, for example, is a silicon substrate. A current leakage isolation doped region 102 is formed in the semiconductor substrate 100. The current leakage isolation doped region 102, for example, is formed by ion implantation. A current leakage isolation structure 116 is formed in the semiconductor substrate 100. The current leakage isolation structure 116 is disposed at terminals of subsequently-formed embedded bit lines. According to another embodiment of the invention, the current leakage isolation structure 116 may be formed after the formation of embedded bit lines or embedded world lines. Besides, the current leakage isolation structure 116 is an STI structure, for instance. In an alternative, the current leakage isolation structure 116 can also be a doped region.

A mask layer 126 is then formed on the semiconductor substrate 100. A material of the mask layer 126 is, for example, silicon nitride. The mask layer 126 is, for example, formed by chemical vapor deposition. Thereafter, a plurality of trenches 128 are formed by patterning the mask layer 126 and the semiconductor substrate 100. The trenches 128 are arranged in parallel in the semiconductor substrate 100 and extended along the column direction (i.e. the Y direction). An insulating layer 110 is then formed on the semiconductor substrate 100. A material of the insulating layer 110 is, for example, silicon oxide, and the insulating layer 110 is formed by chemical vapor deposition or thermal oxidation, for example.

As shown in FIG. 2B to FIG. 5B, a trench filling material layer 132 is formed in the trenches 128. A distance W1 exists between a surface of the trench filling material layer 132 and surfaces of the trenches 128. A material of the trench filling material layer 132 is, for example, polysilicon. Besides, a method of forming the trench filling material layer 132 exemplarily includes forming a material layer filling the trenches 128 and removing a portion of the material layer by performing an etch-back process. The etch-back process also removes a portion of the insulating layer 110 on a surface of the mask layer 126.

Next, a liner layer 134 is formed on a surface of the insulating layer 110. A material of the liner layer 134 and the material of the insulating layer 110 have different etching selectivity. The liner layer 134, for example, is made of silicon nitride, and the liner layer 134 is formed by chemical vapor deposition or nitrification, for example.

An anisotropic etching process is then performed, and the liner layer 134 on side walls of each of the trenches 128 remains.

With reference to FIG. 2C to FIG. 5C, a portion of the trench filling material layer 132 is removed, such that a second distance W2 exists between the surface of the trench filling material layer 132 and the top surfaces of the trenches 128. Here, the second distance W2 is greater than the first distance W1.

Another liner layer 136 is then formed on the semiconductor substrate 100. A material of the liner layer 136, the material of the insulating layer 110, and the material of the liner layer 134 have different etching selectivity. The material of the liner layer 136, for example, is Ti, TiN, tantalum (Ta), tantalum nitride (TaN), and tungsten nitride (WN), and the liner layer 136 is formed by chemical vapor deposition or physical vapor deposition, for instance. An anisotropic etching process is then performed, and the liner layer 136 remains on a surface of the liner layer 134 and the surface of the insulating layer 110 exposed by the trench filling material layer 132.

A mask layer 138 is then formed on the semiconductor substrate 100, such that the trenches 128 are filled. A material of the mask layer 138 includes boron phosphorous TEOS (BPTEOS) silicon oxide, boron phosphorous silicon glass (BPSG), and TEOS silicon oxide formed by performing an atmospheric pressure chemical vapor deposition (APCVD) process with use of TEOS as a reactive gas. Next, the mask layer 138 is patterned to form openings 140. Each of the openings 140 exposes the liner layer 136 at one side wall of one of the trenches 128. The mask layer 138 is patterned by performing a photolithographic and etching process, for example.

As indicated in FIG. 2D to FIG. 5D, the liner layer 136 at one side wall of each of the trenches 128 is removed by using the mask layer 138 as a mask. The liner layer 136, for example, is removed by wet etching process or dry etching. After the liner layer 136 at one side wall of each of the trenches 128 is removed, the liner layer 134 and a portion of the insulating layer 110 are exposed. The insulating layer 110 exposed by the liner layer 134 is then removed, and openings 142 exposing the semiconductor substrate 100 are formed. The mask layer 138 is removed when removing the insulating layer 110 or before removing the insulating layer 110. A method of removing the insulating layer 110 includes performing a dry etching process.

With reference to FIG. 2E to FIG. 5E, the remaining liner layer 136 is removed. A method of removing the remaining liner layer 136, for example, is wet etching. Next, the trench filling material layer 132 is removed by wet etching, for example. A barrier layer 106b and a conductive layer 106a are sequentially formed in each of the trenches 128, and each of the trenches 128 is filled with the conductive layer 106a. A material of the conductive layer 106a includes a metal material, such as tungsten, copper, aluminum, a copper aluminum alloy, and a silicon copper aluminum alloy. The barrier layer 106b, for example, is made of Ti/TiN or Co/TiN. Here, the Ti layer or the Co layer in the barrier layer 106b reacts with the semiconductor substrate 100, so as to form a silicide layer that acts as the bit line contacts 108. Each of the embedded bit lines 106 is electrically connected to the semiconductor substrate 100 through one of the bit line contacts 108.

As indicated in FIG. 2F to FIG. 5F, a portion of the barrier layer 106b and a portion of the conductive layer 106a are removed, such that a surface of the conductive layer 106a and the barrier layer 106b are located between the bit line contact 108 and the semiconductor layer 100 to form the embedded bit line 106. A method of removing the portion of the barrier layer 106b and the portion of the conductive layer 106a is, for example, wet etching or dry etching. An inter-layer insulating layer 144 is then formed on the semiconductor substrate 100, and each of the trenches 128 is filled by the inter-layer insulating layer 144. A planarization process (e.g. a chemical mechanical polishing process or an etch-back process) is performed, such that the surface of the mask layer 126 is exposed. A material of the inter-layer insulating layer 144 includes BPTEOS silicon oxide, BPSG, SOD (spin on dielectrics), and TEOS silicon oxide formed by performing an APCVD process with use of TEOS as a reactive gas.

With reference to FIG. 2G to FIG. 5G, another mask layer 146 is formed on the semiconductor substrate 100. A material of the mask layer 146 is, for example, silicon nitride or TEOS silicon oxide. The mask layer 146 is, for example, formed by chemical vapor deposition. Thereafter, the mask layer 146, the semiconductor substrate 100, and the inter-layer insulating layer 144 are patterned to form a plurality of trenches 148. The trenches 148 are arranged in parallel in the semiconductor substrate 100 and extended along the row direction (i.e.

the X direction). The trenches 148 are located above the embedded bit lines 106, and there exists an interval between the trenches 148 and the embedded bit lines 106. The semiconductor substrate 100 is divided into a plurality of semiconductor pillars by the trenches 128 and the trenches 148.

As indicated in FIG. 2H to FIG. 5H, a gate dielectric layer 114 is formed on the semiconductor substrate 100. A material of the gate dielectric layer 114 is, for example, silicon oxide, and a method of forming the gate dielectric layer 114 is chemical vapor deposition or thermal oxidation, for example. The gate dielectric layer 114 is formed on surfaces of the semiconductor pillars. A barrier layer 112b and a conductive layer 112a are sequentially formed in each of the trenches 148, and each of the trenches 148 is filled with the conductive layer 112a. A material of the conductive layer 112a includes a metal material, such as tungsten, copper, aluminum, a copper aluminum alloy, and a silicon copper aluminum alloy. The barrier layer 112b, for example, is made of TiN, Ti/TiN, or Co/TiN. A portion of the barrier layer 112b and a portion of the conductive layer 112a are removed, such that a surface of the conductive layer 112a and the barrier layer 112b are lower than a surface of the semiconductor substrate 100. A method of removing the portion of the barrier layer 112b and the portion of the conductive layer 112a is, for example, wet etching or dry etching. An anisotropic etching process is then performed after a mask layer 150 is formed on the semiconductor substrate 100, and the mask layer 150 remains on a side wall of each of the trenches 148. A material of the mask layer 150 includes BPTEOS silicon oxide, BPSG, and TEOS silicon oxide formed by performing an APCVD process with use of TEOS as a reactive gas.

With reference to FIG. 2I to FIG. 5I, the remaining barrier layer 112b and the remaining conductive layer 112a are removed with use of the mask layer 150 as a mask, so as to form two separated embedded word lines 112 in one of the trenches 148. The two embedded word lines 112 clipping one of the semiconductor pillars are connected at the terminals of the embedded word lines 112, as indicated in FIG. 1A and FIG. 1B, and therefore the two embedded word lines 112 are considered as the same embedded word line 112. An inter-layer insulating layer 152 is formed on the semiconductor substrate 100. Each of the trenches 148 is filled with the inter-layer insulating layer 152. A planarization process (e.g. a chemical mechanical polishing process or an etch-back process) is performed, such that the mask layer 146 and a portion of the inter-layer insulating layer 152 on the mask layer 126 are removed. A material of the inter-layer insulating layer 152 includes BPTEOS silicon oxide, BPSG, SOD (spin on dielectrics), and TEOS silicon oxide formed by performing an APCVD process with use of TEOS as a reactive gas.

Next, contact windows 120 and capacitor nodes 118 are sequentially formed on the semiconductor substrate 100.

According to the previous embodiments, an STI structure as a whole or an STI structure formed by a plurality of STI blocks serves as the current leakage isolation structure of the invention.

According to another embodiment of the invention, the current leakage isolation structure is a doped region, for instance. Given the vertical channel transistor is an NMOS transistor, the conductive type of the doped region is P-type; given the vertical channel transistor is a PMOS transistor, the conductive type of the doped region is N-type. A method of forming the doped region includes ion implantation. The current leakage isolation structure of the invention can be formed before forming the trenches 128, or after forming the bit lines 106 but before forming the world lines 112, or after the word lines 112 are formed in the semiconductor substrate 100.

According to the manufacturing method of the vertical channel transistor array of the invention, the current leakage isolation structure is formed at the terminals of the embedded bit lines, and thereby current leakage between the adjacent bit line contacts can be prevented during operation of the vertical channel transistor array. Since the current leakage isolation structure can be the STI structure or the doped region, the simple manufacturing process of the current leakage isolation structure can be easily integrated into the general manufacturing process.

In the manufacturing method of the vertical channel transistor array, the current leakage isolation doped region is formed in the semiconductor substrate located below the embedded bit lines, so as to prevent the adjacent bit line contacts from generating current leakage at the bottoms of the embedded bit lines.

In light of the foregoing, the vertical channel transistor array and the manufacturing method in the invention not only can prevent current leakage between the adjacent bit line contacts but also can improve device performance.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A vertical channel transistor array comprising:
    a plurality of semiconductor pillars disposed in a semiconductor substrate and arranged in a row/column array, wherein each of the semiconductor pillars forms an active region of the vertical channel transistor array;
    a plurality of embedded bit lines filled in a plurality of trenches in the semiconductor substrate, which are arranged in parallel in the semiconductor substrate and extended along a column direction;
    a plurality of bit line contacts, each of the bit line contacts being disposed on a side surface of one of the embedded bit lines and contacted with a side surface of a semiconductor pillar, wherein the embedded bit lines are electrically connected to the semiconductor pillars located in a same column through the bit line contacts;
    a plurality of embedded word lines filled in a plurality of trenches in the semiconductor substrate, which are arranged in parallel above the embedded bit lines and extended along a row direction, wherein the embedded word lines connect the semiconductor pillars in the same row with a gate dielectric layer sandwiched between the embedded word lines and the semiconductor pillars; and
    a current leakage isolation structure disposed at terminals of the embedded bit lines to prevent current leakage between adjacent bit line contacts.

2. The vertical channel transistor array as claimed in claim 1, wherein the current leakage isolation structure is a shallow trench isolation structure.

3. The vertical channel transistor array as claimed in claim 2, wherein the shallow trench isolation structure comprises a plurality of shallow trench isolation blocks.

4. The vertical channel transistor array as claimed in claim 1, wherein the current leakage isolation structure is a doped region.

5. The vertical channel transistor array as claimed in claim 1, wherein each of the embedded word lines is connected to a first side and a second side of one of the semiconductor pillars located in the same row, and the first side is opposite to the second side.

6. The vertical channel transistor array as claimed in claim 1 further comprising a current leakage isolation doped region disposed in the semiconductor substrate located below the embedded bit lines to prevent the adjacent bit line contacts from generating current leakage at bottoms of the embedded bit lines.

7. The vertical channel transistor array as claimed in claim 1, wherein each of the embedded bit lines comprises a barrier layer and a conductive layer.

8. The vertical channel transistor array as claimed in claim 1 further comprising an insulating layer disposed between each of the embedded bit lines and the semiconductor substrate.

9. The vertical channel transistor array as claimed in claim 1, wherein a material of the embedded bit lines comprises silicide.

\* \* \* \* \*